(12) United States Patent
Akimoto et al.

(10) Patent No.: US 7,094,289 B2
(45) Date of Patent: Aug. 22, 2006

(54) METHOD FOR MANUFACTURING HIGHLY-CRYSTALLIZED OXIDE POWDER

(75) Inventors: Yuji Akimoto, Fukuoka (JP); Masami Nakamura, Kasuga (JP); Kazuro Nagashima, Ohnojo (JP)

(73) Assignee: Shoei Chemical Inc., Tokyo (JP)

( * ) Notice: Subject to any disclaimer, the term of this patent is extended or adjusted under 35 U.S.C. 154(b) by 92 days.

(21) Appl. No.: 10/630,394

(22) Filed: Jul. 30, 2003

(65) Prior Publication Data

US 2004/0028592 A1 Feb. 12, 2004

(30) Foreign Application Priority Data

Aug. 7, 2002 (JP) ............................. 2002-230595
Aug. 28, 2002 (JP) ............................. 2002-249781

(51) Int. Cl.
*C30B 25/06* (2006.01)

(52) U.S. Cl. ............................. 117/91; 117/92; 117/93; 117/99; 117/102; 117/944

(58) Field of Classification Search .................. 117/91, 117/92, 93, 99, 102, 944
See application file for complete search history.

(56) References Cited

U.S. PATENT DOCUMENTS

| | | | |
|---|---|---|---|
| 4,049,789 A | * 9/1977 | Manabe et al. | .......... 252/519.1 |
| 4,929,436 A | 5/1990 | Legrand et al. | |
| 4,980,141 A | * 12/1990 | Kimura et al. | .............. 423/263 |
| 5,152,974 A | 10/1992 | Legrand et al. | |
| 5,582,771 A | * 12/1996 | Yoshimaru et al. | .... 252/519.53 |
| 5,851,428 A | * 12/1998 | Matsuda et al. | ...... 252/301.4 R |
| 6,627,115 B1 | 9/2003 | Hampden-Smith et al. | |
| 2001/0052589 A1 | * 12/2001 | Hampden-Smith et al. | .................... 252/301.4 S |
| 2002/0197461 A1 | * 12/2002 | Takaya et al. | .............. 428/210 |
| 2004/0009109 A1 | * 1/2004 | Akimoto et al. | ............. 423/263 |

FOREIGN PATENT DOCUMENTS

| | | |
|---|---|---|
| CN | 1012725 B | 6/1991 |
| CN | 1162617 A | 10/1997 |
| DE | 100 02 394 C1 | 5/2001 |
| EP | 1 215 174 A1 | 6/2002 |
| EP | 1215174 | * 6/2002 |
| JP | XP-002261662 | 10/1990 |
| JP | 5-310425 | 11/1993 |
| JP | 2001-152146 | 6/2001 |
| JP | 2003-104790 | * 4/2003 |

* cited by examiner

*Primary Examiner*—Robert Kunemund
(74) *Attorney, Agent, or Firm*—Flynn, Thiel, Boutell & Tanis, P.C.

(57) ABSTRACT

A method for manufacturing a highly-crystallized oxide powder, wherein an oxide powder is produced by ejecting a starting material powder containing at least one metal element and/or semimetal element, which will become a constituent component of the oxide, into a reaction vessel together with a carrier gas through a nozzle; and heating the starting material powder at a temperature higher than the decomposition temperature or reaction temperature thereof and not lower than (Tm/2)° C., where Tm° C. stands for a melting point of the oxide, in a state in which the starting material powder is dispersed in a gas phase at a concentration of not higher than 10 g/L. In the above method, the starting material powder may be mixed and dispersed in the carrier gas by using a dispersing machine prior to being ejected into the reaction vessel through a nozzle. The resultant oxide powder has a high crystallinity, a high dispersibility, and a uniform particle size, without introducing impurities thereinto, by a low-cost and simple production equipment.

18 Claims, No Drawings

METHOD FOR MANUFACTURING HIGHLY-CRYSTALLIZED OXIDE POWDER

BACKGROUND OF THE INVENTION

1. Field of the Invention

The present invention relates to a method for manufacturing a highly-crystallized metal oxide powder, semimetal oxide powder, or double oxide powder comprising at least two metal elements and/or semimetal elements. In particular, the present invention relates to a method for the manufacture of an oxide powder with a high dispersibility and a high crystallinity that has a high purity and a uniform particle size, this powder being suitable for functional materials for electronics such as phosphor materials, dielectric materials, magnetic materials, conductive materials, semiconductive materials, superconductive materials, piezoelectric materials, magnetic recording materials, positive electrode materials for secondary batteries, and electromagnetic wave absorbing materials, catalyst materials, and starting materials for the manufacture thereof, or for industrial materials that can be used in a variety of other fields.

2. Description of the Prior Art

Powders of metal oxides, semimetal oxides and double oxides comprising at least two metal elements and/or semimetal elements (those powders will be collectively referred to hereinbelow as "oxide powders", unless stated otherwise) employed as functional materials are desired to have a high purity, to be compositionally homogeneous, and to have a high crystallinity in order to demonstrate fully their functions. In particular, in order to improve phosphor characteristics such as fluorescence intensity of phosphors, a highly-crystallized oxide powder is required, this powder containing a small amount of impurities, having no defects or lattice deformations on the surface of particles or inside thereof, being compositionally homogeneous, in particular, having a very small amount of activation elements uniformly distributed therein, and preferably consisting of a single phase.

When an oxide powder is molded and heat treated by a sintering process to manufacture a sintered body, property control of the oxide powder as a starting material is also important. For example, in order to obtain high-performance oxide cores or oxide permanent magnets with excellent magnetic properties and mechanical properties, the oxide powder used as a starting material is required to consist of fine particles, to have a uniform particle size and an isotropic shape, and to be a single crystal.

Furthermore, when an oxide powder is dispersed in a matrix such as a resin or the like and used in the form of a thick-film paste, ink, paint, sheet, powder compact, or other compositions and composite materials, it is important that in addition to the improvement of properties inherent to the oxide, the particle shape and size be uniform and agglomeration of particles be prevented in order to improve dispersibility, packing density, and processability. In particular, a fine monodisperse powder with a mean particle diameter of about 0.1–10 μm, a narrow particle size distribution, and no agglomeration is desired for thick-film pastes or inks.

Oxide powders have been manufactured in the past by a solid-phase reaction method, a gas-phase reaction method, a liquid-phase reaction method, and a spray pyrolysis method.

With the solid-phase reaction method, a mixture of starting material powders such as oxalates, carbonates, oxides, and the like is placed in a firing container such as a crucible or the like and heated at a high temperature for a long time to induce a solid-phase reaction, followed by grinding in a ball mill or the like. However, the oxide powder manufactured by this method has an irregular shape and consists of particle aggregates with a large particle size distribution. Moreover, a large amount of impurities are introduced from the crucible or in the grinding process. Further, when double oxides are manufactured, treatment is required to be conducted for a long time at a high temperature in order to improve compositional homogeneity. As a result, the production efficiency is poor. Furthermore, the particle surface was modified and a large number of defects were produced on the particle surface and inside thereof by chemical reactions and physical impacts during grinding. As a result, the crystallinity was decreased and physical properties inherent to oxides were degraded.

With the gas-phase method by which vapors of metals or metal compounds are reacted in a gas phase, fine oxide powders can be manufactured. However, not only the cost is high, but agglomeration easily occurs in the obtained powder and the particle diameter is difficult to control.

Examples of the liquid-phase reaction method include a liquid-phase precipitation method, a hydrothermal method, and a method based on hydrolysis of inorganic salts or alkoxides. Those methods produce fine oxide powders with a comparatively small surface modification and a high crystallinity. However, fine powders without agglomeration and with a high dispersibility are difficult to manufacture. Furthermore, high-purity starting materials are necessary and a long time is required for the reaction and separation operation, which results in a high production cost.

With the spray pyrolysis method, a solution obtained by dissolving or dispersing a metal compound in water or an organic solvent is sprayed to obtain fine liquid droplets and the droplets are heated under the conditions allowing a metal oxide to precipitate, thereby producing a metal oxide powder. With such a method, agglomeration-free fine monodisperse particles can be obtained and the amount of introduced impurities is small. Furthermore, because the starting materials are in the form of a solution, metal components can be mixed homogeneously at any ratio. For those reasons, this method is considered to be suitable for the manufacture of double oxide powders. For example, Japanese Patent Publication No. 2001-152146 described the manufacture of a fine phosphor powder with excellent fluorescence properties by this method.

However, the spray pyrolysis method uses a large amount of water or an organic solvent such as an alcohol, acetone, an ether, and the like to obtain liquid droplets of the metal compounds used as a starting material. For this reason, a large quantity of energy is required to evaporate the solvent, energy loss during pyrolysis is increased, and the cost rises. Furthermore, the atmosphere control during pyrolysis is difficult because of solvent decomposition. In addition, the particle size distribution of the produced particles sometimes becomes wide because of merging and splitting of liquid particles in the reaction vessel. For those reasons, the reaction conditions such as the spraying rate, the concentration of liquid droplets in a carrier gas, the retention time in the reaction vessel, and the like are difficult to set and the productivity is poor. Moreover, this method is limited to those starting materials that can be used to obtain solutions or suspensions. Therefore, a limitation is placed on the compositional range and concentration of starting materials, and the types of oxide powders that can be manufactured are limited.

SUMMARY OF THE INVENTION

It is an object of the present invention to manufacture an oxide powder having a high crystallinity, a high dispersibility, and a uniform particle size, without introducing impurities thereinto, by low-cost and simple production equipment. In particular the present invention provides a manufacturing method suitable for the manufacture of functional oxide powders such as phosphors that are strongly required to have good compositional homogeneity and a high crystallinity, or an oxide powder serving as a starting material for functional ceramics and functional composite materials. It is yet another object to obtain an oxide powder with a high purity, a high dispersibility, a high crystallinity, and a uniform particle size as well as a shape and a particle size suitable for thick-film pastes such as phosphor pastes, inks, paints, and the like.

Accordingly, the present invention is as follows.

1. A method for manufacturing a highly-crystallized oxide powder, wherein an oxide powder is produced by ejecting a starting material powder comprising at least one element selected from the group consisting of metal elements and semimetal elements that will become a constituent component of the oxide which is to be produced into a reaction vessel together with a carrier gas through a nozzle; and heating the starting material powder at a temperature higher than the decomposition temperature or reaction temperature thereof and not lower than $(Tm/2)°$ C., where $Tm°$ C. stands for a melting point of the oxide which is to be produced, in a state in which the starting material powder is dispersed in a gas phase at a concentration of not higher than 10 g/L.

2. The method described in above item 1, wherein the starting material powder is ejected into the reaction vessel under the condition that V/S>600, where V (L/min) is a flow rate of the carrier gas per unit time and S ($cm^2$) is a cross-sectional area of the opening of the nozzle.

3. The method described in above item 1 or 2, wherein the starting material powder is mixed and dispersed in the carrier gas with a dispersing machine prior to being ejected into the reaction vessel through the nozzle.

4. The method according to any of claims 1 to 3, wherein the particle size of the starting material powder is adjusted in advance.

5. The method described in any of above items 1 to 4, wherein the starting material powder comprises at least two elements selected from the group consisting of metal elements and semimetal elements at a substantially constant compositional ratio in individual particles of the starting material powder and the produced oxide is a double oxide.

6. The method described in above item 5, wherein individual particles constituting the starting material powder are composed of an alloy comprising at least two elements selected from the group consisting of metal elements and semimetal elements or a composite comprising at least two materials selected from the group consisting of metals, semimetals, and compounds thereof, or composed of a single compound comprising at least two elements selected from the group consisting of metal elements and semimetal elements.

7. A method for manufacturing a highly-crystallized oxide powder, comprising:

producing a starting material powder comprising at least two elements selected from the group consisting of metal elements and semimetal elements that will become constituent components of the oxide which is to be produced, at a substantially constant compositional ratio in individual particles of the starting material powder;

collecting the starting material powder;

dispersing the collected starting material powder in a carrier gas by using a dispersing machine;

ejecting the carrier gas having the starting material powder dispersed therein into a reaction vessel through a nozzle; and producing a double oxide powder by heating the starting material powder at a temperature higher than the decomposition temperature or reaction temperature thereof and not lower than $(Tm/2)°$ C., where $Tm°$ C. stands for a melting point of the double oxide which is to be produced, in a state in which the starting material powder is dispersed in a gas phase at a concentration of not higher than 10 g/L.

8. The method described in above item 7, wherein the carrier gas having the starting material powder dispersed therein is ejected into the reaction vessel under the condition that V/S >600, where V (L/min) is a flow rate of the carrier gas per unit time and S ($cm^2$) is a cross-sectional area of the opening of the nozzle.

9. The method described in above item 7 or 8, wherein the particle size adjustment is conducted with a grinding machine before the starting material powder is dispersed in the carrier gas or after it has been dispersed.

10. The method described in any of above items 7 to 9, wherein individual particles constituting the starting material powder are composed of an alloy comprising at least two elements selected from the group consisting of metal elements and semimetal elements or a composite comprising at least two materials selected from the group consisting of metals, semimetals, and compounds thereof, or composed of a single compound comprising at least two elements selected from the group consisting of metal elements and semimetal elements.

11. A highly-crystallized oxide powder, which is manufactured by the method described in any of above items 1 to 10.

12. A highly-crystallized oxide phosphor powder, which is manufactured by the method described in any of above items 1 to 10.

13. A phosphor composition comprising the highly-crystallized oxide phosphor powder described in above item 12.

14. A method for the manufacture of a single-crystal oxide powder, wherein a single-crystal oxide powder is produced by supplying a starting material powder comprising at least one element selected from the group consisting of metal elements and semimetal elements that will become a constituent component of the oxide which is to be produced into a reaction vessel together with a carrier gas; and heating the starting material powder at a temperature higher than the decomposition temperature or reaction temperature thereof and close to or not lower than the melting point of the oxide which is to be produced, in a state in which the starting material powder is dispersed in a gas phase at a concentration of not higher than 10 g/L.

15. A single-crystal oxide powder which is manufactured by the method described in above item 14.

DETAILED DESCRIPTION OF THE PREFERRED EMBODIMENTS

In accordance with the present invention, no specific limitation is placed on the metal elements and semimetal elements (referred to hereinbelow as "metal elements") that will become constituent components of the oxide powder. For example, elements that usually form oxides can be selected, those elements including alkali metals, alkaline earth metals, typical metal elements such as Al, Ga, In, Sn, Tl, Pb, and the like, transition metal elements such as Ti, V, Cr, Mn, Fe, Co, Ni, Cu, Zn, Zr, Nb, Mo, Hf, Ta, W, Ag, Au, platinum group metals, and the like, lanthanide rare earth metal elements such as Y, La, Ce, Gd, Eu, Tb, Sm, Pr, Yb, and the like, and semimetal elements such as P, Si, B, Ge, Sb, Bi, and the like.

Powders of a variety of oxides, that is, metal oxide powders, semimetal oxide powders, or double oxide powders, can be manufactured by the method in accordance with the present invention, and no specific limitation is placed on the type of oxide. Examples of oxides include $SiO_2$, $Al_2O_3$, $TiO_2$, $Fe_3O_4$, $Fe_2O_3$, CoO, $Co_3O_4$, NiO, $Cu_2O$, CuO, ZnO, $Li_2O$, BaO, $Y_2O_3$, $La_2O_3$, $RuO_2$, $Ta_2O_5$, $CeO_2$, $SnO_2$, and $In_2O_3$. The double oxide are referred to herein is an oxide composed of oxygen and at least two elements selected from metal elements and semimetal elements. Examples of double oxides include phosphor materials such as $SrAl_2O_4$:Eu, (Sr, Ca)$B_4O_7$:Eu, $Y_2SiO_5$:Ce, $BaMgAl_{10}O_{17}$:Eu, $BaAl_{12}O_{19}$:Mn, $Y_3Al_5O_{12}$:Ce, $Y_3Al_5O_{12}$:Tb, $Zn_2SiO_4$:Mn, $InBO_3$:Tb, $Y_2O_3$:Eu, $InBO_3$:Eu, $YVO_4$:Eu,$Mg_2SiO_4$:Mn, $Zn_3(PO_4)_2$:Mn, (Y, Gd)$BO_3$:Eu, (Y, Gd)$BO_3$:Tb, $SrTiO_3$:Eu, $ZnO$-$LiGaO_2$, and the like, dielectric materials or piezoelectric materials such as $BaTiO_3$, $SrTiO_3$, $Pb(Mg_{1/3}Nb_{2/3})O_3$, PZT, PLZT, and the like, magnetic materials such as ferrites, and the like, electrically conductive materials such as $Pb_2Ru_2O_6$, ITO, and the like, superconductive materials such as $YBa_2Cu_3O_Y$ and the like, positive electrode materials for secondary batteries, such as $LiMn_2O_4$, $Li_3V_2(PO_4)_3$, $Li_3Fe_2(PO_4)_3$, $LiCoO_2$, $LiNiO_2$, $LiMn_2O_4$, $LaCoO_3$, $LaMnO_3$, and the like, electrode materials for solid electrolyte fuel cells, such as $La_{1-x}Sr_{x+y}CrO_3$ and the like, photocatalytic or photofunctional materials such as $BaTi_4O_9$, $Nb_6O_{17}$, $CuAlo_2$, and the like.

In accordance with the present invention, a powder containing at least one material selected from the group consisting of metals, semimetals, metal compounds, and semimetal compounds is prepared as a starting material powder. Examples of powders of compounds of metals and semimetals include inorganic compound powders or organic compound powders such as oxides, hydroxides, nitrates, sulfates, oxynitrates, oxysulfates, halides, carbonates, borates, silicates, ammonium salts, ammonium complexes, phosphates, carboxylates, resinates, sulfonates, acetylacetonates, alkoxides, amide compounds, imide compounds, urea compounds, and the like. Examples of suitable compounds of semimetal elements such as boron, silicon, phosphorus, and the like include boric acid, phosphoric acid, silicic acid, and the like.

In particular, when a double oxide powder is manufactured, a powder in which a plurality of metallic materials are contained at a substantially constant compositional ratio in each particle is used as a starting material. Examples of such powders include powders of single compounds containing at least two metal elements, for example, powders of complex salts, powders of polynuclear complexes, powders of complex alkoxides, and alloy powders, glass powders, and the like. Furthermore, a powder composed of complex particles or coated complex particles that were prepared in advance by complexing the metals or metal compounds may be also used. The following methods can be used to obtain the above-described compound powders or complex powders containing at least two elements.

(1) A solid-phase reaction method by which metals or metal compounds serving as starting materials are mixed in advance, and heat treated till a compositionally homogeneous structure is obtained and ground.

(2) An alkoxide method by which a plurality of metal alkoxides are reacted and co-condensated, then hydrolyzed and optionally heat treated to obtain a double oxide precursor.

(3) A co-precipitation method by which a precipitating agent selected from among a variety of precipitating agents is added to a solution comprising a plurality of metal compounds and a precipitate is obtained in which the components are mixed homogeneously. For example, a composite of a carbonate or an oxalate is obtained by adding a carbonate or an oxalate to a metal nitrate solution, causing the reaction thereof, filtering the precipitate and drying the same. Alternatively, an oxide composite is obtained by calcining the composite thus obtained.

(4) A urea homogeneous precipitation method by which urea is added to a solution containing a plurality of metal compounds, the reaction is conducted under heating, and a homogeneous precipitate of hydroxides, carbonates, and the like is obtained. The precipitate obtained may be further calcined to obtain an oxide composite.

(5) A complex polymerization method by which an aqueous solution having mixed therein a plurality of metal compounds, a hydroxycarboxylic acid such as citric acid or the like, and a polyol such as ethylene glycol and the like is heated to induce the reaction and to form a homogeneous composite polymer of a metal complex.

(6) A spray pyrolysis method by which a solution or suspension comprising homogeneously a plurality of metal compounds is spray dried or spray pyrolyzed to obtain a composite powder containing a plurality of metal elements at a substantially constant ratio in each particle.

In particular, using a double oxide precursor powder obtained by the alkoxide method, a double oxide precursor powder obtained by a precipitation method such as the co-precipitation method or urea homogeneous precipitation method, a composite polymer powder of a metal complex obtained by the complex polymerization method, and a composite powder obtained by the spray pyrolysis method as a starting material powder is especially preferred because a highly-crystallized double oxide powder with a very high degree of compositional homogeneity can be readily manufactured. The starting material powders prepared by those methods are collected and then mixed with a carrier gas.

A flux component may be further introduced in the starting material powder. The flux acts as a solvent in the solid-phase reaction and, while it is not reactive with the target oxide, it enhances substance movement by creating a very small amount of melt and enhances the reaction. Conventional fluxes such as alkali metal halides, alkaline earth metal halides, boric acid, borates, and the like, for example, sodium chloride, barium fluoride, and the like can be used for this purpose. Those compounds are preferably introduced into individual particles of the starting material powder or coated on the starting material powder.

Oxidizing gases such as air, oxygen, water vapors, and the like, inert gases such as nitrogen, argon, and the like, or gaseous mixtures thereof can be usually used as the carrier gas. When the atmosphere during heat treatment is required to be a reducing atmosphere, reducing gases such as hydrogen, carbon monoxide, methane, ammonia gas, and the like, or organic compounds such as alcohols and carboxylic acids that produce a reducing atmosphere upon decomposition during heating may be admixed. Furthermore, when metal compounds capable of producing a reducing atmosphere by generating carbon monoxide, methane or the like during thermal decomposition (e.g., carboxylates, alkoxides, and composite polymers of metal complexes obtained by the complex polymerization method) are used as the starting material, the reducing atmosphere can be obtained without supplying reducing gases into the reaction system from the outside.

When oxide phosphor powders that require a stringent control of the valence of activator ions are manufactured or oxide powders requiring a controlled oxygen deficiency are manufactured, if a conventional spray pyrolysis method using an aqueous solution is employed, then the atmosphere inside the furnace tends to be an oxidizing atmosphere due to decomposition of water. As a result, the atmosphere is difficult to control even by introducing a reducing gas. For example, in the case of phosphors using divalent Eu ions or trivalent Ce ions as activators, such as $SrAl_2O_4:Eu^{2+}$, $BaMgAl_{10}O_{17}:Eu^{2+}$, $Y_2SiO_5:Ce^{3+}$, and the like, a reducing atmosphere with a considerably strong reducing capacity is required. Therefore, the powders are difficult to manufacture with the spray pyrolysis method. For this reason, the conventional process was complicated, for example, by conducting additional heat treatment of the produced powders in a hydrogen-containing gas atmosphere. However, in accordance with the present invention, because a solvent, such as water or the like, is not used, a strongly reducing atmosphere can be easily produced. The present method is especially suitable when the degree of oxidation of the oxide powder is thus required to be stringently controlled.

In accordance with the present invention, it is important that the solid starting material powder be ejected into a reaction vessel together with a carrier gas through a nozzle and heat treated in a state in which particles of the starting material powder are highly dispersed in a gas phase. Thus, the heat treatment has to be conducted inside a reaction vessel in a state in which the starting material powder is dispersed in a low concentration such as to prevent collisions between the particles of the starting material and the produced particles. For this purpose, the concentration in a gas phase has to be not higher than 10 g/L. If the concentration is higher than this limit, collision and sintering of particles occur and an oxide powder with a uniform particle size cannot be obtained. No specific limitation is placed on the dispersion concentration, provided that it is not higher than 10 g/L, and the dispersion concentration is appropriately determined according to the dispersing apparatus or heating apparatus used. However, if the concentration is too low, the production efficiency is lowered. For this reason, it is desirable that the dispersion concentration be no less than 0.01 g/L.

In order to supply individual particles of the starting material powder into the reaction vessel in a state in which they are dispersed more effectively, the starting material powder is preferably mixed and dispersed in a carrier gas by using a dispersing machine prior to being ejected into the reaction vessel through a nozzle. The conventional dispersing machines of a gas flow type, such as machines of an ejector type, a Venturi type, or an orifice type, or the conventional jet-mill can be used as the dispersing machine.

As a more preferable embodiment, the starting material powder is ejected into the reaction vessel at a high rate under a condition such that V/S>600, where V (L/min) is a flow rate of the carrier gas per unit time and S (cm$^2$) is a cross-sectional area of the opening of the nozzle. As a result, then the starting material powder can be effectively dispersed in a gas phase by rapid expansion of the gas inside the reaction vessel, without causing re-agglomeration. No specific limitation is placed on the nozzle and nozzles of any shape, for example, nozzles with a round, polygonal, or slit-like cross section, nozzles with a tip of a reduced cross section, and nozzles with a reduced cross section in the medium section and expanding opening, may be used.

With the present method, one particle of an oxide powder is considered as formed per one particle of the starting material powder because heating is conducted in a state with a high degree of dispersion in a gas phase. For this reason, the particle size of the resultant oxide powder particles thus formed differs depending on the type of starting material powder, but is in general proportional to the particle size of the starting material powder. Therefore, in order to obtain an oxide powder with a uniform particle diameter, a starting material powder with a uniform particle size is used. When the particle size distribution of the starting material powder is wide, the particle size adjustment is preferably conducted in advance by grinding, comminuting, or classifying with a grinding machine or a classifier. Any of a jet-mill, a wet grinding machine, a dry grinding machine, and the like, may be used as the grinding machine. Further, adjusting the particle size may be conducted prior to dispersing the starting material powder in a carrier gas, but it may be also conducted after or simultaneously with dispersing by using a jet-mill or the like.

In order to conduct heat treatment, while maintaining the dispersed starting material powder at a low concentration, for example, a tubular reaction vessel heated from the outside is used, a starting material powder is ejected together with a carrier gas at a constant flow rate through a nozzle from an opening at one end of the reaction vessel and passed inside the reaction vessel. The oxide powder that is produced by the heat treatment is recovered from the opening at the other end. The passage time of the mixture of the powder and carrier gas through the reaction vessel is set according to the type of apparatus (or vessel) used so that the powder is heated sufficiently at the prescribed temperature. Usually, this time is about 0.3–30 sec. The heating is conducted from the outside of the reaction vessel, for example, with an electric furnace or a gas furnace, but a combustion flame obtained by supplying a combustion gas into the reaction vessel may be also used.

The heating is conducted at a temperature higher than the decomposition temperature or reaction temperature of the starting material powder under the conditions producing an oxide powder. The heat treatment should be conducted at a temperature of no less than (Tm/2)° C., where Tm° C. denotes the melting point of the oxide. If the heating temperature is below (Tm/2)° C., the target oxide powder cannot be obtained. In order to obtain an oxide powder with an even higher crystallinity, the heating is preferably conducted at a temperature of no less than the sintering initiation temperature of the target oxide.

In accordance with the present invention, the starting material powder is heated in a state in which it is dispersed at a low concentration and thoroughly uniformly in a gas phase by means of a high-speed gas flow from a nozzle. Therefore, the dispersed state can be maintained without agglomeration of particles caused by fusion and sintering even at a high temperature, and a solid-phase reaction is supposedly initiated inside each particle simultaneously with the pyrolysis. Apparently because the solid-phase reaction proceeds in a small area, crystal growth is enhanced within a short period of time and an oxide powder is obtained which has a high crystallinity and few internal defects, and consists of primary particles showing no agglomeration. Furthermore, in particular, in the case of double oxides, because the constituent elements are contained inside each particle of the starting material powder at a substantially constant compositional ratio, a double oxide powder having a very homogeneous composition can be obtained.

Further, when the starting material powder produces nitrides, carbides, and the like during or after the pyrolysis, the heating has to be conducted under the conditions causing decomposition thereof.

When the above-mentioned flux components are introduced into the starting material powder, a highly-crystallized oxide powder can be obtained under the same heating conditions due to the effect of the flux as a reaction enhancer. The flux components can be removed by the conventional method such as washing after the oxide powder has been produced.

The optimum heating temperature differs depending on the composition and intended application of the oxide powder, the required degree of crystallinity, and the required characteristics such as particle shape and heat resistance. Therefore, the heating temperature is determined appropriately according to the target characteristics. For example, in the case of oxide phosphors, the heating temperature is preferably about 1200 to 1800° C., and in the case of oxide electrode materials for batteries, which has a poor heat resistance, the heating temperature is preferably not higher than 900° C.

When the heating is conducted at a comparatively low temperature, the shape of particles in the produced powder is usually the same as that of the starting material powder. If the heating temperature is increased, the automorphism of the crystals becomes apparent. Generally, in order to obtain a highly-crystallized or single-crystal oxide powder with a uniform particle shape, the heating is preferably conducted at a temperature in the vicinity of the melting point of the target oxide or above it. For example, in order to obtain highly-crystallized spherical powders of ferrites, the pyrolysis has to be conducted at least at 1200° C.

If desired, the oxide powder obtained may be further subjected to annealing. For example, in the case of phosphors, the annealing is conducted at a temperature of 400 to 1800° C. The annealing apparently increases crystallinity and controls the valence of activators, thereby making it possible to increase the fluorescence intensity, and to control the afterglow persistence and emission color tone. The powder obtained in accordance with the present invention has a high crystallinity of particles and maintains the homogeneity of composition. Therefore, agglomeration of particles due to sintering hardly occurs even when annealing is conducted at a high-temperature.

The method in accordance with the present invention makes it possible to obtain highly-crystallized oxide powders with any desired mean particle diameter and a narrow particle size distribution and is especially suitable for the manufacture of phosphor powders used in phosphor compositions such as phosphor pastes, phosphor inks, phosphor green sheets, and the like, an also oxide powders for thick-film pastes. In order to manufacture the phosphor pastes and phosphor inks, the highly-crystallized oxide phosphor powder manufactured by the method in accordance with the present invention is uniformly mixed and dispersed in an organic vehicle composed of a resin, a solvent, and the like, by the usual method. The phosphor green sheets are obtained by appropriately mixing the highly-crystallized oxide phosphor powder in accordance with the present invention with a resin and a solvent to obtain a slurry, casting the slurry, for example, by a doctor blade method, on a flexible resin film, and then drying. Inorganic binders such as glass particles and the like, pigments, and other additives may be added to the above-mentioned phosphor compositions or thick-film pastes.

The present invention will be described hereinbelow in greater detail based on the examples thereof and comparative examples.

($Y_2O_3$:$Eu^{3+}$Phosphor Powder)

EXAMPLE 1

Europium nitrate hexahydrate and yttrium nitrate hexahydrate were weighed to give 4 mol % of europium nitrate hexahydrate based on yttrium nitrate hexahydrate and dissolved in deionized water to obtain an aqueous solution with a total metal ion concentration of about 0.1 mol/L. An aqueous solution of ammonium carbonate was added to the prepared solution at normal temperature and yttrium and europium were co-precipitated. The precipitate thus obtained was filtered out, collected, dried at a temperature of 100° C., and ground with a jet-mill to obtain a carbonate composite powder having a homogeneous composition and a uniform particle size with a mean particle diameter of about 2 µm.

The powder obtained was ejected at a feed rate of 5 kg/hr through a nozzle with a cross-sectional area of the opening of 0.13 cm$^2$ together with air at a flow rate of 200 L/min as a carrier gas into a reaction tube heated to a temperature of 1550° C. in an electric furnace, passed through the reaction tube, while maintaining the dispersion concentration of the powder, and heated. The dispersion concentration of the starting material powder in the gas phase inside the reaction tube was 0.4 g/L, and V/S was 1500. A white powder thus obtained was collected with a bag filter.

According to the analysis of the powder thus obtained with an X ray diffractometer, it was a double oxide powder with extremely good crystallinity that consisted of a single phase represented by $(Y_{0.96}Eu_{0.4})_2O_3$. Further, observations conducted with a scanning electron microscope (SEM) showed a powder that consisted of agglomeration-free particles having an almost spherical shape and a narrow particle size distribution with a mean particle diameter of 1 µm and with a maximum particle diameter of 3 µm. Further, measurements of an emission spectrum at a wavelength of 612 nm under ultraviolet(UV) irradiation at a wavelength of 147 nm showed that the fluorescence intensity was 150% of the fluorescence intensity of the powder with a mean particle diameter of 3 µm that was obtained by the conventional solid-phase reaction method.

EXAMPLE 2

A carbonate composite powder with a mean particle diameter of about 2 µm that was prepared in the same manner as in Example 1 was mixed with an air carrier gas by using an ejector-type dispersing machine. The solid-gas mixture thus obtained was ejected through a nozzle with a cross-sectional area of the opening of 0.13 cm$^2$ at a flow rate of 200 L/min into a reaction tube heated to a temperature of 1550° C. in an electric furnace, passed through the reaction tube and heated. The feed rate of the powder, the dispersion concentration of the starting material powder in the gas phase in the reaction tube, and V/S were identical to those of Example 1 and were 5 kg/hr, 0.4 g/L, and 1500, respectively.

The powder obtained was confirmed by the X ray diffraction analysis to be a $(Y_{0.96}Eu_{0.4})_2O_3$ powder with a very high crystallinity. The results of SEM observations demonstrated that the powder obtained consisted of agglomeration-free spherical particles and had a mean particle diameter of 0.8 μm and a maximum particle diameter of 2 μm, that is, had a particle size less and particle size distribution narrower than the powder of Example 1 that was obtained without using the dispersing machine. The fluorescence intensity at a wavelength of 612 nm under UV irradiation at a wavelength of 147 nm was identical to that of Example 1.

EXAMPLES 3, 4

Double oxide powders were manufactured in the same manner as in Example 1, except that the temperature of the electric furnace was 1450° C. and 1650° C., respectively. The characteristics of the powders obtained are shown in Table 1.

Further, the fluorescence intensity presented in the table is the fluorescence intensity at a wavelength of 612 nm under UV irradiation at a wavelength of 147 nm and is a relative intensity which is referred to the fluorescence intensity of a $(Y_{0.96}Eu_{0.4})_2O_3$ powder with a mean particle diameter of 3 μm that was obtained by the conventional solid-phase reaction method, the latter fluorescence intensity being taken as 100. The crystallinity is represented by a relative intensity referring to the X ray diffraction intensity of the powder of Example 1 that was taken as 100.

EXAMPLE 5

The process was conducted in the same manner as in Example 1, except that the feed rate of the starting material powder was 1.25 kg/hr. The dispersion concentration of the starting material powder in the gas phase was 0.1 g/L. The characteristics of the powder obtained are shown in Table 1.

EXAMPLE 6

The process was conducted in the same manner as in Example 1, except that the feed rate of the starting material powder was 62.5 kg/hr and the mean particle diameter of the starting material powder was 4 μm. The dispersion concentration of the starting material powder in the gas phase was 5.0 g/L. The characteristics of the powder obtained are shown in Table 1.

EXAMPLE 7

A double oxide powder was manufactured in the same manner as in Example 1, except that the cross-sectional area of the opening of the nozzle was 0.03 cm². The characteristics of the powder obtained are shown in Table 1.

EXAMPLE 8

A double oxide powder was manufactured in the same manner as in Example 1, except that the cross-sectional area of the nozzle opening was 0.28 cm². The characteristics of the powder obtained are shown in Table 1.

EXAMPLE 9

A double oxide powder was manufactured in the same manner as in Example 1, except that the cross-sectional area of the nozzle opening was 0.50 cm². The crystallinity and fluorescence characteristic of the powder thus obtained were good, but SEM observations confirmed the presence of a small amount of large particles of irregular shape.

EXAMPLE 10

Europium nitrate hexahydrate and yttrium nitrate hexahydrate were weighed to give 4 mol % of Europium nitrate hexahydrate based on yttrium nitrate hexahydrate and dissolved in deionized water to obtain an aqueous solution with a total metal ion concentration of about 0.1 mol/L. The solution was processed in an ultrasonic atomizer to obtain fine liquid droplets, and spray pyrolysis was conducted at a temperature of 700° C. by using air as a carrier gas. The product was collected with a bag filter and a $Y_2O_3$-EuO composite powder with a mean particle diameter of about 2 μm was obtained. The $Y_2O_3$-EuO composite powder was ground with a jet-mill to obtain a mean particle diameter of about 0.5 μm, followed by mixing with an air carrier by using an orifice-type dispersing machine. The solid-gas mixture thus obtained was ejected through a nozzle with a cross-sectional area of the opening of 0.13 cm² at a flow rate of 200 L/min into a reaction tube heated to a temperature of 1550° C. in an electric furnace, similarly to Example 2, and heated by passing through the reaction tube. The feed rate of the powder, the dispersion state of the starting material powder in the gas phase in the reaction tube, and V/S were 5 kg/hr, 0.4 g/L, and 1500, respectively.

The powder obtained was a spherical powder of $(Y_{0.96}Eu_{0.4})_2O_3$ with a very high crystallinity. The characteristics of the powder obtained are shown in Table 1.

COMPATATIVE EXAMPLE 1

The process was conducted in the same manner as in Example 1, except that the feed rate of the starting material powder was 150 kg/hr. The powder concentration in the gas phase in the reaction tube was 12.0 g/L. SEM observations of the powder obtained showed that a plurality of particles were fused forming large particles of irregular shape and the powder had a wide particle size distribution. The characteristics of the powder are shown in Table 1.

Comparative Example 2

The process was conducted in the same manner as in Example 1, except that the temperature of the electric furnace was 1100° C. The heating temperature was below ½ of the melting point (about 2300° C.) of $(Y_{0.96}Eu_{0.4})_2O_3$ The powder obtained consisted of rectangular columnar particles and had a low crystallinity. The fluorescence intensity was also decreased. The characteristics of the powder are shown in Table 1.

TABLE 1

| | Concentration of starting material powder in gas phase (g/L) | Cross-sectional area of nozzle opening S (cm$^2$) | V/S | Heating temp. (° C.) | Mean particle diameter of starting material powder (μm) | Properties of produced powder | | | |
|---|---|---|---|---|---|---|---|---|---|
| | | | | | | Mean particle diameter (μm) | Maximum particle diameter (μm) | Fluorescence intensity | Crystallinity |
| Example 1 | 0.4 | 0.13 | 1500 | 1550 | 2 | 1 | 3 | 150 | 100 |
| Example 3 | 0.4 | 0.13 | 1500 | 1450 | 2 | 1 | 3 | 100 | 90 |
| Example 4 | 0.4 | 0.13 | 1500 | 1650 | 2 | 1 | 3 | 150 | 98 |
| Example 5 | 0.1 | 0.13 | 1500 | 1550 | 2 | 0.7 | 1.5 | 150 | 100 |
| Example 6 | 5.0 | 0.13 | 1500 | 1550 | 4 | 3 | 8 | 150 | 98 |
| Example 7 | 0.4 | 0.03 | 6700 | 1550 | 2 | 0.7 | 1.5 | 150 | 100 |
| Example 8 | 0.4 | 0.28 | 710 | 1550 | 2 | 1 | 4 | 150 | 100 |
| Example 9 | 0.4 | 0.50 | 400 | 1550 | 2 | 1.5 | 8 | 150 | 100 |
| Example 10 | 0.4 | 0.13 | 1500 | 1550 | 0.5 | 0.5 | 1 | 150 | 100 |
| Comparative Example 1 | 12.0 | 0.13 | 1500 | 1550 | 2 | 5 | 30 | 130 | 90 |
| Comparative Example 2 | 0.4 | 0.13 | 1500 | 1100 | 2 | 1 | 3 | 10 | 30 |

($BaMgAl_{10}O_{17}:Eu^{2+}$ phosphor)

EXAMPLE 11

Barium nitrate, europium nitrate hexahydrate, magnesium nitrate hexahydrate, and aluminum nitrate nonahydrate were weighed to obtain a molar ratio Ba:Eu:Mg:Al=0.9:0.1:1:10 and dissolved in deionized water. Citric acid was then added in a molar amount of 1.5 times the molar amount of all the metal ions and dissolved, followed by the addition of ethylene glycol in a molar amount equal to that of citric acid. The solution obtained was heated at a temperature of 150° C. under stirring and a gel-like polymer was obtained. The polymer was heated at a temperature of 400° C. to remove binding components and ground in a jet-mill to obtain a starting material powder with a uniform particle size and a mean particle diameter of about 2 μm.

The powder obtained was ejected at a feed rate of 5 kg/hr through a nozzle with a cross-sectional area of the opening of 0.13 cm$^2$ together with nitrogen containing 1% hydrogen at a flow rate of 200 L/min as a carrier gas into a reaction tube heated to a temperature of 1600° C. in an electric furnace, passed through the reaction tube, while maintaining the dispersion concentration of the powder, and heated. The dispersion concentration of the starting material powder in the gas phase inside the reaction tube was 0.4 g/L, and V/S was 1500. The powder thus obtained was collected with a bag filter.

In the analysis of the powder thus obtained with an X ray diffractometer, only a diffraction line of $Ba_{0.9}Eu_{0.1}MgAl_{10}O_{17}$ was confirmed. SEM observations showed plate-like particles having a uniform particle size with a mean particle diameter of about 1 μm and a maximum particle diameter of about 4 μm. Further, measurements of an emission spectrum at a wavelength of 450 nm under UV irradiation at a wavelength of 147 nm showed that the fluorescence intensity was equal to the fluorescence intensity of the powder with a mean particle diameter of 4 μm that was obtained by the conventional solid-phase reaction method.

($BaFe_{12}O_{19}$ Ferrite)

EXAMPLE 12

Barium nitrate and iron nitrate nonahydrate were weighed to obtain a molar ratio of 1:12 and dissolved in deionized water to obtain a solution with a total metal ion concentration of about 0.2 mol/L. The solution was heated at a temperature of 80° C., urea was added to give a concentration of urea of 2 mol/L under stirring and a homogeneous precipitation reaction caused by the urea hydrolysis reaction was initiated. Once the pH of the solution reached 8, the reaction system was cooled and the reaction was terminated. The precipitate thus formed was filtered, dried at a temperature of 100° C. and then calcined at a temperature of 600° C. Then grinding was conducted in a jet-mill and a starting material powder with a uniform particle size and a mean particle diameter of about 2 μm was obtained.

The powder obtained was ejected at a feed rate of 5 kg/hr through a nozzle with a cross-sectional area of the opening of 0.13 cm$^2$ together with air at a flow rate of 200 L/min as a carrier gas into a reaction tube heated to a temperature of 1300° C. in an electric furnace, passed through the reaction tube, while maintaining the dispersion concentration of the powder, and heated. The dispersion concentration of the starting material powder in the gas phase inside the reaction tube was 0.4 g/L, and V/S was 1500. The powder thus obtained was collected with a bag filter. SEM observations of the powder obtained showed plate-like particles having a narrow particle size distribution with a mean particle diameter of about 1 μm and a maximum particle diameter of 3 μm. In the analysis with an X ray diffractometer, only an acute diffraction line of $BaFe_{12}O_{19}$ was confirmed.

($BaTiO_3$ Dielectric)

EXAMPLE 13

Equimolar amounts of barium chloride hydrate and titanium chloride were dissolved in deionized water and a solution was prepared with a total metal ion concentration of 0.1 mol/L. The solution was dropwise added to a 0.5 mol/L aqueous solution of oxalic acid, and a barium titanyl oxalate precipitate was formed. The precipitate was filtered, washed with water, calcined at a temperature of 500° C., and then wet ground with a bead mill by using zirconia balls with a diameter of 0.3 mm, and dried to give a starting material powder. The starting material powder was comminuted in a jet-mill by using air at a flow rate of 200 L/min, dispersed and directly ejected at a feed rate of 5 kg/hr through a nozzle with a cross-sectional area of the opening of 0.13 cm$^2$ into a reaction tube heated to a temperature of 1100° C. in an electric furnace. The dispersion concentration of the starting material powder in the gas phase inside the reaction tube was 0.4 g/L, and V/S was 1500. The starting material powder was passed through the reaction tube, while maintaining the dispersion concentration of the powder, and heated. The powder obtained was collected with a bag filter. SEM observations of the powder obtained confirmed the presence of agglomeration-free particles with a mean particle diameter of about 0.2 μm and a maximum particle diameter of 0.4 μm. In the analysis with an X ray diffractometer, only an acute diffraction line of tetragonal $BaTio_3$ was confirmed.

(ZnO Powder)

EXAMPLE 14

A commercial high-purity zinc oxide powder (zinc white) was ground with a jet-mill and a powder having a uniform particle size with a mean particle diameter of about 2 μm was obtained. The powder was ejected at a feed rate of 5 kg/hr through a nozzle with a cross-sectional area of the opening of 0.13 $cm^2$ together with air at a flow rate of 200 L/min as a carrier gas into a reaction tube heated to a temperature of 1200° C. in an electric furnace, passed through the reaction tube, while maintaining the dispersion concentration of the powder, and heated. The dispersion concentration of the starting material powder in the gas phase inside the reaction tube was 0.4 g/L, and V/S was 1500. The white powder thus obtained was collected with a bag filter.

The analysis of the powder obtained with an X ray diffractometer showed the oxide powder with a very high crystallinity and which consisted of ZnO single phase. Observations conducted with a scanning electron microscope (SEM) confirmed a powder which consisted of agglomeration-free particles having an almost spherical shape and a narrow particle size distribution with a maximum particle diameter of 5 μm and a mean particle diameter of 2 μm.

EXAMPLES 15–19

Oxide powders were manufactured in the same manner as in Example 14, except that the dispersion concentration of the starting material powders in the gas phase, cross-sectional area of the opening of the nozzle, and the temperature of the electric furnace were selected from the temperatures shown in Table 2. Characteristics of the powders obtained are shown in Table 2. The crystallinity is represented by a relative intensity referring to the X ray diffraction intensity of the powder of Example 14 that was taken as 100.

Comparative Example 3

The process was conducted in the same manner as in Example 14, except that the feed rate of the starting material powder was 150 kg/hr. The powder concentration in the gas phase inside the reaction tube was 12.0 g/L. SEM observations of the powder obtained showed that a plurality of particles were fused forming large particles of irregular shape and the powder had a wide particle size distribution. The characteristics of the powder obtained are shown in Table 2.

Comparative Example 4

The process was conducted in the same manner as in Example 14, except that the temperature of the electric furnace was 800° C. The heating temperature was below ½ of about 2000° C. (under pressure) which is the melting point of zinc oxide. The powder obtained had an irregular particle shape and a low crystallinity. The characteristics of the powder obtained are shown in Table 2.

TABLE 2

| | Type of oxide | Concentration of starting material powder in gas phase (g/L) | Cross-sectional area of nozzle opening S ($cm^2$) | V/S | Heating temp. (° C.) | Properties of produced powder | | |
|---|---|---|---|---|---|---|---|---|
| | | | | | | Mean particle diameter (μm) | Maximum particle diameter (μm) | Crystallinity |
| Example 14 | ZnO | 0.4 | 0.13 | 1500 | 1200 | 2 | 5 | 100 |
| Example 15 | ZnO | 0.1 | 0.13 | 1500 | 1200 | 1.5 | 3 | 100 |
| Example 16 | ZnO | 5.0 | 0.13 | 1500 | 1200 | 3 | 8 | 100 |
| Example 17 | ZnO | 0.4 | 0.03 | 6700 | 1200 | 1.5 | 4 | 100 |
| Example 18 | ZnO | 0.4 | 0.28 | 710 | 1200 | 2 | 6 | 100 |
| Example 19 | ZnO | 0.4 | 0.50 | 400 | 1200 | 3 | 12 | 100 |
| Comparative Example 3 | ZnO | 12.0 | 0.13 | 1500 | 1200 | 8 | 40 | 90 |
| Comparative Example 4 | ZnO | 0.4 | 0.13 | 1500 | 800 | 2 | 6 | 70 |

EXAMPLE 20

A commercial zinc carbonate powder was ground with a jet-mill and a starting material powder with a mean particle diameter of about 0.2 μm was obtained. The powder fed at a feed rate of 1.25 kg/hr was mixed with an air carrier gas by a using an ejector-type dispersing machine and the solid-gas mixture thus obtained was ejected at a flow rate of 200 L/min into a reaction tube heated to a temperature of 1200° C. in an electric furnace through a nozzle with a cross-sectional area of the opening of 0.13 $cm^2$, passed through the reaction tube, and heated. The dispersion concentration of the starting material powder in the gas phase inside the reaction tube were 0.1 g/L, and V/S was 1500. The white powder thus obtained was collected with a bag filter.

The powder obtained was confirmed by the X ray analysis to be a ZnO powder with good crystallinity. SEM observation results showed that the powder consisted of agglomeration-free spherical particles having a maximum particle diameter of 0.8 μm and a mean particle diameter of 0.2 μm.

($CeO_2$ Powder)

EXAMPLE 21

A cerium oxalate powder was prepared by adding an aqueous solution of ammonium oxalate to an aqueous solution of cerium chloride under stirring, causing the precipitation of cerium oxalate, filtering, and drying. The powder was ground with a jet-mill to obtain a starting material powder with a mean particle diameter of about 1 μm. The powder was ejected at a feed rate of 5 kg/hr through a nozzle with a cross-sectional area of the opening of 0.13 cm$^2$ together with air at a flow rate of 200 L/min as a carrier gas into a reaction tube heated to a temperature of 1500° C. in an electric furnace, passed through the reaction tube, while maintaining the dispersion concentration of the powder, and heated. The melting point of cerium oxide is about 1950° C. The dispersion concentration of the starting material powder in the gas phase inside the reaction tube was 0.4 g/L, and V/S was 1500. The light-yellow powder thus produced was collected with a bag filter.

The powder obtained was confirmed by the X ray analysis to be a $CeO_2$ powder with good crystallinity. SEM observation results showed that the powder consisted of agglomeration-free spherical particles having a maximum particle diameter of 2 μm and a mean particle diameter of 0.8 μm.

($TiO_2$ Powder)

EXAMPLE 22

Water-containing titanium oxide manufactured by hydrolysis of titanyl sulfate was ground and dispersed with a jet-mill by using air at a flow rate of 200 L/min, directly ejected through a nozzle with a cross-sectional area of the opening of 0.13 cm$^2$ into a reaction tube heated to a temperature of 1400° C. in an electric furnace, passed through the reaction tube, while maintaining the dispersion concentration of the powder, and heated. The melting point of titanium oxide is about 1850° C. The dispersion concentration of the starting material powder in the gas phase inside the reaction tube was 0.4 g/L, and V/S was 1500. The white powder thus produced was collected with a bag filter.

The powder obtained was confirmed by the X ray analysis to be a rutile-type $TiO_2$ powder with good crystallinity. SEM observation results showed that the powder consisted of agglomeration-free spherical particles having a maximum particle diameter of 5 μm and a mean particle diameter of 2 μm.

(Cobalt Oxide Powder)

EXAMPLE 23

Commercial basic cobalt carbonate was ground with a jet-mill and a starting material powder with a mean particle diameter of about 1 μm was obtained. The powder at a feed rate of 5 kg/hr was mixed with an air carrier by using an ejector-type dispersing machine and the solid-gas mixture thus obtained was ejected through a nozzle with a cross-sectional area of the opening of 0.13 cm$^2$ at a flow rate of 200 L/min into a reaction tube heated to a temperature of 1500° C. in an electric furnace, passed through the reaction tube, while maintaining the dispersion concentration of the powder, and heated. The melting point of cobalt oxide is about 1935° C. The dispersion concentration of the starting material powder in the gas phase inside the reaction tube was 0.4 g/L, and V/S was 1500. The dark gray powder thus obtained was collected with a bag filter.

The powder obtained was confirmed by the X ray analysis to be a mixed CoO and $Co_3O_4$ powder with good crystallinity. SEM observation results showed that the powder consisted of agglomeration-free spherical particles having a maximum particle diameter of 1.5 μm and a mean particle diameter of 0.7 μm.

The present invention makes it possible to obtain easily an oxide powder with a homogeneous composition, a high crystallinity, and a high dispersibility, this powder consisting of agglomeration-free primary particles with a uniform particle shape. Further, a high-purity powder with few impurities can be obtained because no additive or solvent adversely affecting purity is used. Furthermore, because a grinding process is not required, few defects and stresses are present on the particle surface and inside thereof.

Furthermore, with the present method, controlling the particle size and dispersion conditions of the starting material powder makes it possible to obtain an oxide powder with a uniform particle diameter, which has any desired mean particle diameter within a range from no more than 0.1 μm to about 20 μm. Such a method is especially suitable for the manufacture of fine powders with a narrow particle size distribution used as thick-film paste materials. Further, the powder obtained is also useful for a variety of functional materials and starting materials therefor, as well as for sintered materials and composite materials.

Further, because starting materials are not in the form of a solution or suspension, the energy loss on solvent evaporation is less than that of the usual spray pyrolysis method and manufacturing can be conducted at a low cost. Moreover, the problem of liquid droplets merging with each other is avoided and dispersing in a gas phase can be conducted to a comparatively high concentration as compared with the spray pyrolysis method, thereby providing for a high efficiency. Moreover, because it is not necessary for the starting materials to be formed into a solution or suspension, the starting materials can be selected from a wide range of materials. Therefore, oxide powders of a variety of types can be manufactured.

Furthermore, with the present method no oxidizing gas is produced from the solvents. Therefore, the method is also suitable for the manufacture of double oxide powders requiring synthesis under a low-oxygen pressure. Moreover, a reducing atmosphere can be obtained inside the system during decomposition by selecting appropriate starting material compounds. In this case, no supply of reducing gas from the outside is necessary and oxidation can be suppressed. Therefore, setting the reaction conditions is simple.

In particular, the oxide phosphors manufactured by the present method are highly-crystallized, compositionally homogeneous powders having no surface or internal defects or lattice distortions and having small amounts of activator ions uniformly dispersed therein. Such powders have excellent phosphor characteristics such as fluorescence intensity and the like. Moreover, because the powder consists of fine monodisperse particles with uniform particle shape and diameter, phosphor pastes with excellent dispersibility can be manufactured, the powder packing density attained by coating such pastes is high and a film thickness can be decreased.

What is claimed is:

1. A method for manufacturing a highly-crystallized oxide powder, wherein an oxide powder is produced by ejecting a starting material powder comprising at least one element selected from the group consisting of metal elements and semimetal elements that will become a constituent component of the oxide which is to be produced into a reaction vessel together with a carrier gas through a nozzle; and heating the starting material powder at a temperature higher than the decomposition temperature or reaction temperature thereof and not lower than (Tm/2)° C., where Tm° C. stands for a melting point of the oxide which is to be produced, in a state in which the starting material powder is dispersed in a gas phase at a concentration of not higher than 10 g/L, wherein an oxygen source for the oxide powder is supplied from the starting material powder and/or the carrier gas.

2. The method according to claim 1, wherein the starting material powder is ejected into the reaction vessel under the condition that V/S >600, where V (L/min) is a flow rate of the carrier gas per unit time and S (cm2) is a cross-sectional area of the opening of the nozzle.

3. The method according to claim 1, wherein the starting material powder is mixed and dispersed in the carrier gas with a dispersing machine prior to being ejected into the reaction vessel through the nozzle.

4. The method according to claim 1, wherein the particle size of the starting material powder is adjusted in advance.

5. The method according to claim 1, wherein the starting material powder comprises at least two elements selected from the group consisting of metal elements and semimetal elements at a substantially constant compositional ratio in individual particles of the starting material powder and the produced oxide is a double oxide.

6. The method according to claim 5, wherein individual particles constituting the starting material powder are composed of an alloy comprising at least two elements selected from the group consisting of metal elements and semimetal elements or a composite comprising at least two materials selected from the group consisting of metals, semimetals, and compounds thereof, or composed of a single compound comprising at least two elements selected from the group consisting of metal elements and semimetal elements.

7. A method for manufacturing a highly-crystallized oxide powder, comprising:
producing a starting material powder comprising at least two elements selected from the group consisting of metal elements and semimetal elements that will become constituent components of the oxide which is to be produced, at a substantially constant compositional ratio in individual particles of the starting material powder;
collecting the starting material powder;
dispersing the collected starting material powder in a carrier gas by using a dispersing machine;
ejecting the carrier gas having the starting material powder dispersed therein into a reaction vessel through a nozzle; and
producing a double oxide powder by heating the starting material powder at a temperature higher than the decomposition temperature or reaction temperature thereof and not lower than (Tm/2)° C., where Tm° C. stands for a melting point of the double oxide which is to be produced, in a state in which the starting material powder is dispersed in a gas phase at a concentration of not higher than 10 g/L, wherein an oxygen source for the oxide powder is supplied from the starting material powder and/or the carrier gas.

8. The method according to claim 7, wherein the carrier gas having the starting material powder dispersed therein is ejected into the reaction vessel under the condition that V/S >600, where V (L/min) is a flow rate of the carrier gas per unit time and S (cm2) is a cross-sectional area of the opening of the nozzle.

9. The method according to claim 7, wherein the particle size adjustment is conducted with a grinding machine before the starting material powder is dispersed in the carrier gas or after it has been dispersed.

10. The method according to claim 7, wherein individual particles constituting the starting material powder are composed of an alloy comprising at least two elements selected from the group consisting of metal elements and semimetal elements or a composite comprising at least two materials selected from the group consisting of metals, semimetals, and compounds thereof, or composed of a single compound comprising at least two elements selected from the group consisting of metal elements and semimetal elements.

11. A highly-crystallized oxide powder, which is manufactured by the method according to claim 1.

12. A highly-crystallized oxide powder, which is manufactured by the method according to claim 7.

13. A highly-crystallized oxide phosphor powder, which is manufactured by the method according to claim 1.

14. A highly-crystallized oxide phosphor powder, which is manufactured by the method according to claim 7.

15. A phosphor composition comprising the highly-crystallized oxide phosphor powder according to claim 13.

16. A phosphor composition comprising the highly-crystallized oxide phosphor powder according to claim 14.

17. A method for the manufacture of a single-crystal oxide powder, wherein a single-crystal oxide powder is produced by supplying a starting material powder comprising at least one element selected from the group consisting of metal elements and semimetal elements that will become a constituent component of the oxide which is to be produced into a reaction vessel together with a carrier gas through a nozzle; and heating the starting material powder at a temperature higher than the decomposition temperature or reaction temperature thereof and close to or not lower than the melting point of the oxide which is to be produced, in a state in which the starting material powder is dispersed in a gas phase at a concentration of not higher than 10 g/L, wherein an oxygen source for the oxide powder is supplied from the starting material powder and/or the carrier gas.

18. A single-crystal oxide powder which is manufactured by the method according to claim 17.

* * * * *